United States Patent
Xu et al.

(10) Patent No.: US 9,116,673 B2
(45) Date of Patent: Aug. 25, 2015

(54) STORAGE SERVER RACK SYSTEM AND STORAGE SERVERS

(71) Applicants: Inventec (Pudong) Technology Corporation, Shanghai (CN); INVENTEC CORPORATION, Taipei (TW)

(72) Inventors: Ji-Peng Xu, Shanghai (CN); Er-Zhen Song, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 314 days.

(21) Appl. No.: 13/775,884

(22) Filed: Feb. 25, 2013

(65) Prior Publication Data

US 2014/0078663 A1 Mar. 20, 2014

(30) Foreign Application Priority Data

Sep. 18, 2012 (CN) .......................... 2012 1 0349479

(51) Int. Cl.
*G06F 1/20* (2006.01)
*G06F 1/18* (2006.01)
*H05K 7/14* (2006.01)

(52) U.S. Cl.
CPC *G06F 1/20* (2013.01); *G06F 1/187* (2013.01); *G06F 1/188* (2013.01); *H05K 7/1488* (2013.01)

(58) Field of Classification Search
CPC ....... G06F 1/20; G06F 11/3058; G06F 1/181; G06F 1/183; G06F 1/187; G06F 1/26; G06F 1/189; G06F 1/206; G06F 1/188; G06F 1/266; G06F 9/5094; G06F 11/2041; G06F 11/3031; G06F 11/3044; G06F 11/3051; G06F 11/3062; G06F 1/184; G06F 1/185; G06F 2212/2532; G06F 3/0683; H05K 7/1492; H05K 7/1489; H05K 7/20836; H05K 7/1487; H05K 7/20727; H05K 7/20736; H05K 7/1488; H05K 7/1491; H05K 7/1498; H05K 7/20136; H05K 7/20172; H05K 7/20209; H05K 7/20754; H05K 7/20772; H05K 7/20781; B60H 1/00735; B60H 1/00642
USPC ............ 361/679.02, 679.48, 679.31, 679.37, 361/679.4, 695, 724, 622, 679.39, 725, 727, 361/752; 312/223.2, 236; 211/26; 454/184
See application file for complete search history.

(56) References Cited

U.S. PATENT DOCUMENTS 6,510,050 B1 * 1/2003 Lee et al. ................. 361/679.33
7,843,685 B2 * 11/2010 Beauchamp et al. .... 361/679.49

(Continued)

*Primary Examiner* — Hung S Bui
*Assistant Examiner* — Michael Matey
(74) *Attorney, Agent, or Firm* — Locke Lord LLP; Tim Tingkang Xia, Esq.

(57) ABSTRACT

A storage server rack system includes a rack and multiple storage servers assembled inside the rack. The rack includes an integrated power module and a fan wall. The integrated power module distributes a power to the storage servers. The fan wall is disposed by a side of the storage servers for dissipating heat. Each storage server includes a case, an electrical connection module, a motherboard and multiple storage units. The case has a first lateral side and a second lateral side disposed oppositely to each other. The electrical connection module is disposed on the first lateral side and connected to the integrated power module. The motherboard is disposed inside a first heat dissipation space in the case and electrically connected to the electrical connection module. The storage units are disposed outside the first heat dissipation space in the case and electrically connected to the electrical connection module.

12 Claims, 2 Drawing Sheets

(56) References Cited

U.S. PATENT DOCUMENTS

2008/0037214 A1* 2/2008 Niazi et al. .................... 361/687
2011/0292587 A1* 12/2011 Tseng ...................... 361/679.31
2012/0044631 A1* 2/2012 Wei ......................... 361/679.47
2012/0069514 A1* 3/2012 Ross ........................ 361/679.33
2012/0113592 A1* 5/2012 Chen ............................. 361/695
2013/0282944 A1* 10/2013 Shaw et al. ................... 710/305

* cited by examiner

STORAGE SERVER RACK SYSTEM AND STORAGE SERVERS

CROSS-REFERENCE TO RELATED APPLICATIONS

This non-provisional application claims priority under 35 U.S.C. §119(a) on Patent Application No(s). 201210349479.0 filed in China, P.R.C. on Sep. 18, 2012, the entire contents of which are hereby incorporated by reference.

BACKGROUND OF THE INVENTION

1. Technical Field of the Invention

The disclosure relates to a rack system and a server, more particularly to a storage server rack system and a storage server.

2. Description of the Related Art

As information grows considerably, the demand for storage of information by companies continues to grow. Therefore, the storage density enhancement of products has become a pressing target to be achieved by companies. Currently in the market, there are products mainly designed for storing information, such as storage server. In order that a space can be utilized to the uttermost, the exterior appearance of a storage server is usually designed standardly for using with a rack. Generally, a storage server rack system comprises a large amount of layers of racks. Additionally, a storage server is mostly flatly structured in order that it can be pushed inside or pulled out from a rack like a drawer. For the objective of high storage density, the entire rack is designed for accommodating many layers of storage servers.

When a storage server performs accessing and storing of information, the heating power of electronic elements inside the storage sever increases continuously. Other storage servers in the rack also produce large amount of heat at the same time. In order to prevent the electronic elements inside the storage server from overheating to cause the temporary or permanent failure of the electronic elements, it is highly demanded that the storage server is provided with sufficient heat dissipation efficiency.

SUMMARY OF THE INVENTION

In an embodiment, the disclosure provides a storage server rack system comprising a rack and a plurality of storage servers. The rack comprises an integrated power module and a fan wall. The integrated power module distributes a power obtained outside of the rack to the storage servers. The fan wall being disposed on a side outside of the storage servers for dissipating the heat of the storage servers. The storage servers are assembled inside the rack, Each of which comprises a case, an electrical connection module, a motherboard and a plurality of storage units. The case has a first lateral side and a second lateral side disposed oppositely to each other. A direction from the first lateral side to the second lateral side is defined as a first direction. The first direction is defined for the fan wall to get an air current through, either extracting it from the case or blowing it toward the inside of the case. An electrical connection module is disposed on the first lateral side of the case and connected to the integrated power module. A motherboard is disposed inside a first heat dissipation space in the case and electrically connected to the electrical connection module. The first heat dissipation space extends from the first lateral side toward the second lateral side along the first direction. The storage units are disposed outside the first heat dissipation space in the case and electrically connected to the electrical connection module. The electrical connection module is disposed outside of the first heat dissipation space.

The disclosure further provides a storage server configured for assembling inside a rack. The rack comprises an integrated power module and a fan wall. The integrated power module is configured for distributing a power obtained outside of the rack to the storage server. The fan wall is disposed on a side outside of the storage server for dissipating the heat of the storage server. The storage server comprises a case, an electrical connection module, a motherboard and a plurality of storage units. The case has a first lateral side and a second lateral side disposed oppositely to each other. A direction from the first lateral side to the second lateral side is defined as a first direction. The first direction is defined for the fan wall to get an air current through, either extracting it from the case or blowing it toward the inside of the case. The electrical connection module is disposed on the first lateral side of the case and connected to the integrated power module. The motherboard is disposed inside a first heat dissipation space in the case and electrically connected to the electrical connection module. The first heat dissipation space extends from the first lateral side toward the second lateral side along the first direction. The storage units are disposed outside the first heat dissipation space in the case and electrically connected to the electrical connection module. The electrical connection module is disposed outside of the first heat dissipation space.

BRIEF DESCRIPTION OF THE DRAWINGS

The disclosure will become more fully understood from the detailed description given herein below for illustration only, and thus does not limit the disclosure, wherein.

DETAILED DESCRIPTION

Figure 1:
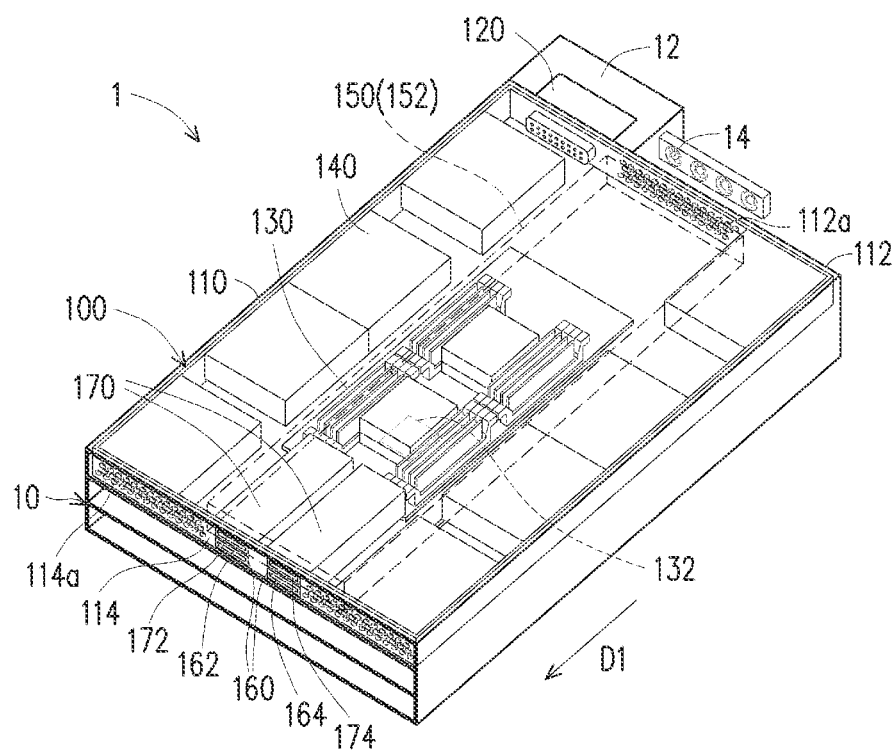
FIG. 1 is a perspective view of a storage server inserted into a rack according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
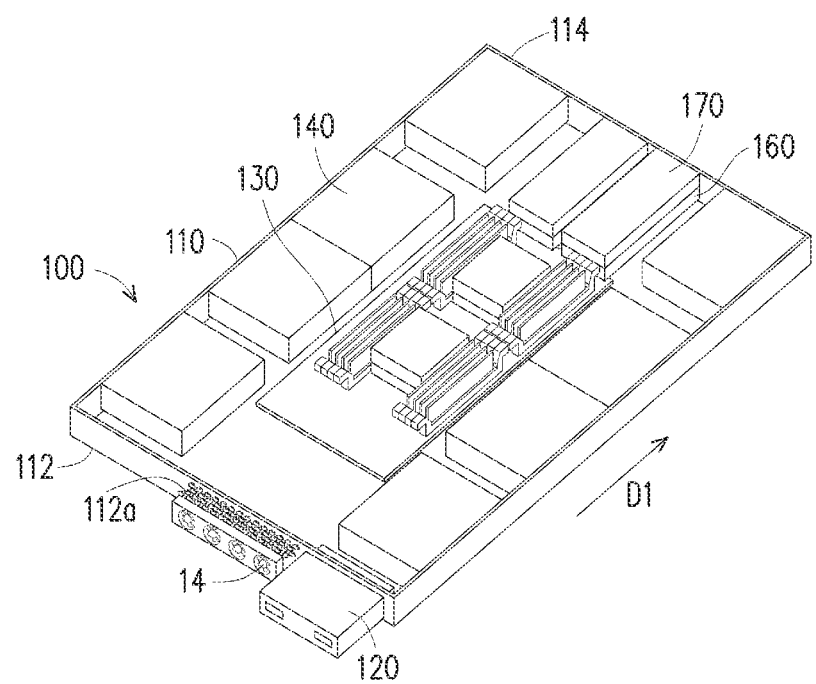
FIG. 2 is a perspective view of an internal configuration of the storage server in FIG. 1.
Figure 3:
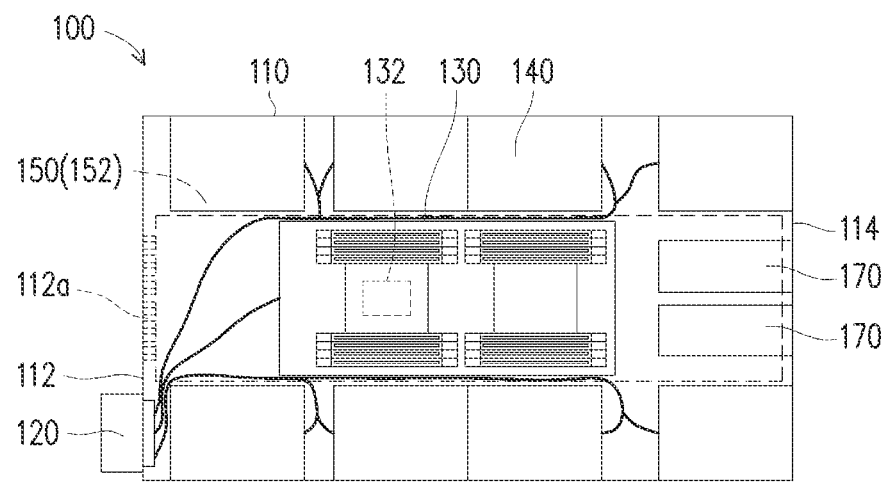
FIG. 3 is a top view of the internal configuration of the storage server in FIG. 1.

FIG. 1 is a partial perspective view of a storage server frame system according to an embodiment of the disclosure. In FIG. 1, in order to explicitly show the internal arrangement of storage servers placing in a rack, a top cover of a case of the storage server is hidden, and the storage server frame system is only partially illustrated. FIG. 2 is a perspective view of an internal configuration of the storage server in FIG. 1. FIG. 3 is a top view of the internal configuration of the storage server in FIG. 1.

Please refer to FIG. 1 to FIG. 3. A storage server rack system 1 of this embodiment comprises a rack 10 and a plurality of storage servers 100. The rack 10 comprises an integrated power module 12 and a fan wall 14. The integrated power module 12 distributes a power obtained outside of the rack 10 to the storage servers 100. The fan wall 14 is disposed on a side outside of the storage servers 100 for dissipating the heat of the storage servers 100. The storage servers 100 are assembled inside the rack 10. Since FIG. 1 only illustrates the storage server rack system 1 partially, only one layer of the fan wall 14 is shown. Practically, the fan wall 14 can be embodied in many layers for dissipating the heat of the storage servers 100 disposed in the rack 10.

Each of the storage servers 100 comprises a case 110, an electrical connection module 120, a motherboard 130 and a plurality of storage units 140. The case 110 has a first lateral side 112 and a second lateral side 114 disposed oppositely to the first lateral side 112. A direction from the first lateral side 112 to the second lateral side 114 is a first direction D1. The fan wall 14 extracts an air current from the case 110 oppositely along the first direction D1 or blows an air current toward the inside of the case 110 along the first direction D1. The electrical connection module 120 is disposed on the first lateral side 112 of the case 110 and connected to the integrated power module 12. The motherboard 130 is disposed inside a first heat dissipation space 150 in the case 110 and electrically connected to the electrical connection module 120. The first heat dissipation space 150 extends from the first lateral side 112 toward the second lateral side 114 along the first direction D1. The storage units 140 are disposed outside the first heat dissipation space 150 in the case 110 and electrically connected to the electrical connection module 120. The electrical connection module 120 is disposed outside of the first heat dissipation space 150.

Since the storage servers 100 can be pushed inside or pulled out from the rack 10 like a drawer, when the storage servers 100 are required to be placed in the rack 10, the first lateral sides 112 of the storage servers 100 is configured for being inserted into the rack 10. Furthermore, the two sides of the rack 10 limit the inserting direction of the storage servers 100 so that the electrical connection modules 120 of the storage servers 100 can connect to the integrated power module 12 of the rack 10 directly. Thereby, the power of the integrated power module 12 of the rack 10 is configured for being transmitted to the storage servers 100 through the electrical connection modules 120.

The motherboard 130 and the storage units 140 are disposed inside the case 110 respectively and connected to the electrical connection module 120. As shown in FIG. 3, in this embodiment, the motherboard 130 and the storage units 140 are connected to the electrical connection module 120 via power cords. In other embodiments, the motherboard 130 and the storage units 140 may be connected to the electrical connection module 120 via their own interfaces. However, the ways of the motherboard 130 and the storage units 140 connecting to the electrical connection module 120 should not be construed as a limitation to the disclosure. In this embodiment, the power of the storage server 100 obtained from the integrated power module 12 of the rack 10 is configured for being transmitted to the motherboard 130 and the storage units 140 through the electrical connection module 120 and power cords. Thereby, the motherboard 130 and the storage units 140 are electrically connected to the integrated power module 12.

As shown in FIG. 1, the rack 10 comprises a plurality of spaces configured for storing the storage server 100. When a plurality of the storage server 100 is placed in the rack 10, the storage server 100, then, is configured for being connected to the integrated power module 12 of the rack 10 through the electrical connection module 120 of each of the storage server 100, and each of the storage server 100 is configured for being supplied with the power by the integrated power module 12 of the rack 10.

Furthermore, since a width of the motherboard 130 of this embodiment is approximately half of a width of the case 110, when the motherboard 130 is placed inside the case 110, excessive space is still available by two sides of the motherboard 130 for storing the storage units 140. Therefore, the storage units 140 is configured for being arranged in two rows and disposed by the two sides of the motherboard 130. In other words, the storage units 140 are disposed by two sides of the first heat dissipation space 150. Moreover, since the storage server 100 of this embodiment is connected to the integrated power module 12 of the rack 10 through the electrical connection module 120 in order to introduce the power of the integrated power module 12 into the storage server 100, the disposition of devices such as integrated power module is not required inside the storage server 100. Therefore, more space inside the case 110 may be available for accommodating more of the storage units 140. Thereby, the storage servers 100 of this embodiment have higher storage density.

In this embodiment, a quantity of the storage units 140 inside the case 110 is eight, and the storage units 140 are 3.5 inch hard disks arranged in two rows and disposed by the two sides of the motherboard 130. In other embodiments, the storage units 140 may also be 2.5 inch hard disks or solid state drives. However, the type and quantity of the storage units 140 should not be construed as limitations to the disclosure. Additionally, in other embodiments, the storage units 140 are configured for being disposed only by one side of the motherboard 130. Nonetheless, the disposing relationship between the storage units 140 and the motherboard module 130 should not be construed as a limitation to the disclosure.

The motherboard 130 of this embodiment comprises a heat source 132. In this embodiment, the heat source 132 is a central processing unit. Nevertheless, the type of the heat source 132 should not be construed as a limitation to the disclosure. When the storage units 140 of the storage server 100 are accessing or storing data, the processes of reading and storing of data are performed and assigned by the central processing unit of the motherboard 130. In this assignment process, the operation of the central processing unit produces a large amount of heat, and may cause the central processing unit to overheat and result in the temporary or permanent failure of the central processing unit. In some cases, errors or missing of data may occur during the processes of accessing and storing of data.

In this embodiment, inside the case 110 of the storage server 100, since a height of the storage units 140 is higher than a height of the motherboard 130, the first heat dissipation space 150 becomes an air passage 152. Thereby, the heat produced by the heat source 132 of the motherboard 130 is configured for departing from the case 110 along the air passage 152.

Furthermore, as shown in FIG. 3, projections of the storage units 140 on the first lateral side 112 do not overlap with a projection of the motherboard 130 on the first lateral side 112, and none of the storage units 140 or the integrated power module 12 are disposed between the motherboard 130 and the first lateral side 112. In other words, a vacant space is arranged between the motherboard 130 and the first lateral side 112. The air passage 152 between the motherboard 130 and the first lateral side 112 is free without obstruction.

As shown in FIG. 3, in this embodiment, a plurality of heat dissipation holes 112a is on the first lateral side 112 against the first heat dissipation space 150 and locates on the projection of the motherboard 130 on the first lateral side 112. The heat dissipation holes 112a are connected with the first heat dissipation space 150 (namely, the air passage 152). Therefore, the fan wall 14 of the rack 10 is configured for extracting an air current from the case 110 or blowing an air current toward the inside of the case 110 in order to reduce a temperature of the storage server 100. In the storage server 100 of this embodiment, the air passage 152 is formed by disposing the storage units 140 by the two sides of the motherboard 130. The motherboard 130 is disposed in the air passage 152 with the heat dissipation holes 112a on the first lateral side 112 so that the heat source 132 of the motherboard 130 inside the case 110 is able to be provided with excellent heat dissipation effects.

In this embodiment, the location of the electrical connection module 120 disposed on the first lateral side 112 corresponds to the location of one of the rows of the storage units 140. Therefore, a projection of the electrical connection module 120 on the first lateral side 112 does not overlap with the projection of the motherboard 130 on the first lateral side 112. In other words, the electrical connection module 120 does not block the heat dissipation holes 112a of the first lateral side 112, so the disposition of the electrical connection module 120 influences nothing on the air passage 152.

Additionally, in this embodiment, the storage server 100 further comprises at least one expansion unit 160 disposed inside the case 110 and electrically connected to the motherboard 130. As shown in FIG. 1, the storage server 100 of this embodiment comprises two of the expansion units 160. One of the expansion units 160 comprises an output interface 162, and the other expansion unit 160 comprises an input interface 164. The output interface 162 or the input interface 164 is exposed out of the second lateral side 114 of the case 110.

In this embodiment, transmission interfaces of the output interface 162 or the input interface 164 of the expansion units 160 are serial advanced technology attachment (SATA), integrated drive electronics (IDE), peripheral component interconnect (PCI-E) or universal serial bus (USB). However, the transmission interfaces of the output interface 162 or the input interface 164 of the expansion units 160 should not be construed as limitations to the disclosure.

The storage server 100 of this embodiment has the output interface 162 or the input interface 164 on the second lateral side 114 and the electrical connection module 120 on the first lateral side 112, so when placing the storage server 100 into the rack 10, the first lateral side 112 of the storage server 100 is inserted into the rack 10 so that the electrical connection modules 120 of the storage server 100 could connect to the integrated power module 12 of the rack 10 directly. Furthermore, since the output interface 162 or the input interface 164 is exposed out of the second lateral side 114 of the case 110, when the storage server 100 is placed in the rack 10, the second lateral side 114 is disposed on an outer side of the rack 10. Therefore, it is more convenient for a user to insert an external device into the output interface 162 or the input interface 164 on the second lateral side 114.

Moreover, in this embodiment, an expanding module 170 is disposed on each of the expansion units 160. Each of the expanding modules 170 comprises at least one output interface 172 or at least one input interface 174. Each of the output interfaces 172 or each of the input interfaces 174 are exposed out of the second lateral side 114 of the case 110, and superimposed on the output interface 162 or the input interface 164 of each of the expansion units 160.

Furthermore, the storage units 140 produce heat during the operation. Since heat is transmitted from somewhere with a higher temperature to somewhere with a lower temperature, the temperature of the motherboard 130 in the air passage 152 could be prevented through thermal convection from increasing continuously Comparing with the storage units 140, a temperature of the motherboard 130 is configured for being kept lower than that of the storage units 140. Under this condition, the heat of the storage units 140 disposed by the two sides of the air passage 152 is transmitted toward the air passage 152 (a central), and therefore the heat produced by the storage units 140 will be carried away from the case 110 through the air passage 152. Additionally, as shown in FIG. 1, a plurality of heat dissipation holes 114a is disposed on a location of the second lateral side 114 against the storage units 140. The heat produced by the storage units 140 is able to be eliminated through the heat dissipation holes 114a. Nonetheless, the ways for dissipating the heat of the storage units 140 should not be construed as a limitation to the disclosure.

As a conclusion, the storage server rack system of the disclosure distributes the power to the storage servers disposed in the rack through the integrated power module of the frame in order that the power can be supplied by the same source, and dissipates the heat of the storage servers simultaneously by the disposition of the fan wall on the side outside of the storage servers. Furthermore, the storage density of the storage servers is able to be effectively enhanced by employing the smaller sized motherboard, disposing the motherboard in the first heat dissipation space inside the case, and disposing the electrical connection module outside of the case in order that more of the storage units is able to be accommodated inside the case. Furthermore, the storage units of the storage servers of the disclosure are disposed outside of the first heat dissipation space. Since the storage units are slightly higher than the motherboard, the air passage is formed between two rows of the storage units. Additionally, since the heat dissipation holes connected with the air passage are disposed on a location of the first lateral side of the case corresponding to the motherboard, the fan wall is configured for extracting an air current from the case or blowing an air current toward the inside of the case through the heat dissipation holes and the air passage. Thereby, the temperatures of the heat sources of the motherboard are reduced, or the heat produced by the heat sources of the motherboard is allowed to depart from the case through the air passage. As a result, heat dissipation effects are able to be improved.

What is claimed is:
1. A storage server rack system, comprising:
a rack comprising an integrated power module and a fan wall; and
a plurality of storage servers assembled inside the rack, the integrated power module is configured for distributing a power obtained outside of the rack to the storage servers, the fan wall being disposed on a side outside of the storage servers for dissipating the heat of the storage servers, each of the storage servers comprising:
a case having a first lateral side and a second lateral side disposed oppositely to each other, a direction from the first lateral side to the second lateral side being defined as a first direction, the fan wall being configured for extracting an air current from the case oppositely along the first direction or blowing an air current toward the inside of the case along the first direction;
an electrical connection module disposed on the first lateral side of the case and connected to the integrated power module;
a motherboard disposed inside a first heat dissipation space in the case and electrically connected to the electrical connection module, the first heat dissipation space extending from the first lateral side toward the second lateral side along the first direction;
a plurality of storage units disposed outside the first heat dissipation space in the case and electrically con- nected to the electrical connection module which is also disposed outside of the first heat dissipation space;

at least one expansion unit disposed inside the case and electrically connected to the motherboard, each of the expansion units comprising at least one output interface or at least one input interface, and each of the output interfaces or each of the input interfaces of the expansion units being exposed out of the second lateral side of the case; and an expanding module disposed on each of the expansion units, each of the expanding modules comprising at least one output interface or at least one input interface, and each of the output interfaces or each of the input interfaces of each of the expanding modules being exposed out of the second lateral side of the case, and superimposed on the output interfaces or the input interfaces of each of the expansion units.

2. The storage server rack system as claimed in claim 1, the motherboard being disposed at a central location of the case, a width of the motherboard being half of a width of the case.

3. The storage server rack system as claimed in claim 1, wherein the storage units are disposed by two sides of the first heat dissipation space.

4. The storage server rack system as claimed in claim 3, wherein a height of the storage units is higher than a height of the motherboard for causing the first heat dissipation space to become an air passage, and the heat produced by a heat source of the motherboard is configured for departing from the case along the air passage.

5. The storage server rack system as claimed in claim 1, wherein a location of the first lateral side against the first heat dissipation space has a plurality of heat dissipation holes.

6. The storage server rack system as claimed in claim 1, wherein a vacant space is arranged between the motherboard and the first lateral side.

7. A storage server configured for assembling inside a rack, the rack comprising an integrated power module and a fan wall, the integrated power module is configured for distributing a power obtained outside of the rack to the storage server, the fan wall being disposed on a side outside of the storage server for dissipating the heat of the storage server, the storage server comprising:

a case having a first lateral side and a second lateral side disposed oppositely to each other, a direction from the first lateral side to the second lateral side being defined as a first direction, the fan wall being configured for extracting an air current from the case oppositely along the first direction or blowing an air current toward the inside of the case along the first direction;

an electrical connection module disposed on the first lateral side of the case and connected to the integrated power module;

a motherboard disposed inside a first heat dissipation space in the case and electrically connected to the electrical connection module, the first heat dissipation space extending from the first lateral side toward the second lateral side along the first direction;

a plurality of storage units disposed outside the first heat dissipation space in the case and electrically connected to the electrical connection module which is disposed outside of the first heat dissipation space;

at least one expansion unit disposed inside the case and electrically connected to the motherboard, each of the expansion units comprising at least one output interface or at least one input interface, and each of the output interfaces or each of the input interfaces of the expansion units being exposed out of the second lateral side of the case; and an expanding module disposed on each of the expansion units, each of the expanding modules comprising at least one output interface or at least one input interface, and each of the output interfaces or each of the input interfaces of each of the expanding modules being exposed out of the second lateral side of the case, and superimposed on the output interfaces or the input interfaces of each of the expansion units.

8. The storage server as claimed in claim 7, the motherboard being disposed at a central location of the case, a width of the motherboard being half of a width of the case.

9. The storage server as claimed in claim 7, wherein the storage units are disposed by two sides of the first heat dissipation space.

10. The storage server as claimed in claim 9, wherein a height of the storage units is higher than a height of the motherboard, so as to cause the first heat dissipation space to become an air passage, and the heat produced by a heat source of the motherboard is configured for departing from the case along the air passage.

11. The storage server as claimed in claim 7, wherein a location of the first lateral side against the first heat dissipation space has a plurality of heat dissipation holes.

12. The storage server as claimed in claim 7, wherein a vacant space is arranged between the motherboard and the first lateral side.

* * * * *